United States Patent
Phan et al.

(10) Patent No.: US 6,809,793 B1
(45) Date of Patent: Oct. 26, 2004

(54) SYSTEM AND METHOD TO MONITOR RETICLE HEATING

(75) Inventors: Khoi A. Phan, San Jose, CA (US); Bhanwar Singh, Morgan Hill, CA (US); Ramkumar Subramanian, Sunnyvale, CA (US); Bharath Rangarajan, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/050,456

(22) Filed: Jan. 16, 2002

(51) Int. Cl.$^7$ .......................... G03B 27/52; G03B 27/72
(52) U.S. Cl. .......................................... 355/30; 355/35
(58) Field of Search .............................. 355/30, 35, 53, 355/67, 68, 69

(56) References Cited

U.S. PATENT DOCUMENTS

| | | | |
|---|---|---|---|
| 4,719,705 A | | 1/1988 | Laganza et al. |
| 4,760,429 A | | 7/1988 | O'Connor |
| 4,768,883 A | | 9/1988 | Waldo et al. |
| 4,824,496 A | | 4/1989 | Seifert et al. |
| 4,922,822 A | | 5/1990 | Bierschenk et al. |
| 4,943,827 A | * | 7/1990 | Good et al. ................ 355/402 |
| 5,064,476 A | | 11/1991 | Recine, Sr. |
| 5,171,372 A | | 12/1992 | Recine, Sr. |
| 5,522,225 A | | 6/1996 | Eskandari |
| 5,581,324 A | * | 12/1996 | Miyai et al. .................. 355/53 |
| 5,604,758 A | | 2/1997 | AuYeung et al. |
| 5,610,965 A | * | 3/1997 | Mori et al. .................. 378/34 |
| 5,689,957 A | | 11/1997 | DeVilbiss et al. |
| 5,689,958 A | | 11/1997 | Gaddis et al. |
| 5,690,849 A | | 11/1997 | DeVilbiss et al. |
| 5,704,213 A | | 1/1998 | Smith et al. |
| 5,727,685 A | | 3/1998 | Laganza et al. |
| 5,780,861 A | | 7/1998 | Apelgren et al. |
| 5,822,993 A | | 10/1998 | Attey |
| 5,867,990 A | | 2/1999 | Ghoshal |
| 5,940,784 A | | 8/1999 | El-Husayni |
| 6,098,408 A | | 8/2000 | Levinson et al. |

OTHER PUBLICATIONS

EUV Lithography (First of Two Parts), Andrew M. Hawryluk et al., Solid State Technology, Jul. 1997, pp 151, 152, 154, 156, and 159.
EUV Lithography (Second of Two Parts), Andrew M. Hawryluk et al., Solid State Technology, Aug. 1997, pp 75, 76, and 78.

* cited by examiner

*Primary Examiner*—Rodney Fuller
(74) *Attorney, Agent, or Firm*—Amin & Turocy, LLP

(57) ABSTRACT

A system and method are disclosed which enable temperature of a substrate, such as mask or reticle, to be monitored and/or regulated. One or more temperature sensors are associated with the substrate to sense substrate temperature during exposure by an exposing source. The sensed temperature is used to control one or more process parameters of the exposure to help maintain the substrate at or below a desired temperature.

22 Claims, 4 Drawing Sheets

SYSTEM AND METHOD TO MONITOR RETICLE HEATING

FIELD OF THE INVENTION

The present invention generally relates to semiconductor processing and, more particularly, to a system and method to monitor reticle heating temperature during fabrication.

BACKGROUND OF THE INVENTION

In the semiconductor industry, there is a continuing trend toward higher device densities. To achieve these high densities there has been and continues to be efforts toward scaling down the device dimensions on semiconductor wafers. In order to accomplish such high device packing density, smaller features sizes are required. This may include the width and spacing of interconnecting lines.

The requirement of small features with close spacing between adjacent features requires high resolution lithographic processes. In general, projection lithography refers to processes for pattern transfer between various media. It is a technique used for integrated circuit fabrication in which a silicon slice, the wafer, is coated uniformly with a radiation-sensitive film, the resist, and an exposing source (such as light, x-rays, or an electron beam) illuminates selected areas of the surface through an intervening master template, the mask or reticle, for a particular pattern. The lithographic coating is generally a radiation-sensitized coating suitable for receiving a projected image of the subject pattern. Once the image is projected, it is indelibly formed in the coating. The projected image may be either a negative or a positive of the subject pattern. Exposure of the coating through a transparency causes the image area to become selectively cross-linked and consequently either more or less soluble (depending on the coating) in a particular solvent developer. The more soluble (e.g., uncross-linked) or deprotected areas are removed in the developing process to leave the pattern image in the coating as less soluble polymer.

Projection lithography is a powerful and essential tool for microelectronics processing. As feature sizes are driven smaller and smaller, optical systems are approaching their limits caused by the wavelengths of the optical radiation. A recognized way of reducing the feature size of circuit elements is to lithographically image them with radiation of a shorter wavelength. "Long" or "soft" x-rays (e.g., extreme ultraviolet (EUV)) are now at the forefront of research in an effort to achieve the smaller desired feature sizes.

EUV lithography may be carried out as follows, EUV radiation is projected onto a resonant-reflective reticle. The resonant-reflective reticle reflects a substantial portion of the EUV radiation which carries an IC pattern formed on the reticle to an all resonant-reflective imaging system (e.g., series of high precision mirrors). A demagnified image of the reticle pattern is projected onto a resist coated wafer. The entire reticle pattern is exposed onto the wafer by synchronously scanning the mask and the wafer, such as during step-and-scan exposure.

Although EUV and other short wavelength lithography provides substantial advantages with respect to achieving high resolution patterning, errors may still result from the lithography process. For instance, the reflective reticle employed in the lithographic process is not completely reflective and consequently will absorb some of the radiation. The absorbed radiation results in heating of the reticle. As the reticle increases in temperature, mechanical distortion of the reticle may result due to thermal expansion of the reticle. Such mechanical distortion of the reticle can manifest in overlay errors. In photolithography, overlay is defied as layer-to-layer registration performance. For example, silicon is a material which may be used as a substrate for a reticle, and silicon has a coefficient of thermal expansion of approximately 2 ppm/° C. Across a typical 100 mm image field, a 0.5° C. deviation in temperature can result in a registration error of 100 nm, in circumstances where <10 nm is desired.

SUMMARY

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

One aspect of the present invention provides a system to monitor temperature of a substrate, such as a mask, reticle or wafer. The system includes one or more temperature sensors operative to sense temperature of the substrate. A control system receives temperature information based on the sensed temperature and provides a control signal based on the temperature information. In a particular aspect, an exposing source exposes the substrate based on the control signal. By way of example, the temperature information can be collected during one or more exposure cycles, such that the control system can control exposure time of the substrate for subsequent exposure cycles based on the temperature information previously collected for that substrate.

Another aspect of the present invention provides a method for monitoring and/or regulating substrate temperature. The substrate is exposed with radiation, such as light of a desired wavelength. The temperature of the substrate is sensed. One or more parameters associated with the exposure of the substrate can then be controlled based on the sensed temperature, which, for example, can include the sensed temperature of the substrate associated with the current and/or previous exposure cycles.

To the accomplishment of the foregoing and related ends, certain illustrative aspects of the invention are described herein in connection with the following description and the annexed drawings. These aspects are indicative, however, of but a few of the various ways in which the principles of the invention may be employed and the present invention is intended to include all such aspects and their equivalents. Other advantages and novel features of the invention will become apparent from the following detailed description of the invention when considered in conjunction with the drawings.

DETAILED DESCRIPTION OF THE INVENTION

The present invention provides a system and method to monitor and/or regulate temperature of a mask or reticle. One or more temperature sensors are associated with the mask or reticle to provide a signal indicative of the temperature of the mask or reticle. The sensed temperature can be used to control process parameters (e.g., exposure time) to help maintain the temperature of the mask or reticle within an expected temperature range. While the present invention is equally applicable to masks, reticles and wafers, for simplicity of explanation and for sake of brevity, the following examples will be described with respect to a reticle.

By way of illustration, reticle heating can occur during exposure of the reticle to short wavelength radiation, such as DUV or EUV light. The region of the reticle being exposed tends to absorb energy from the exposing light, resulting in reticle heating. During fabrication, the effects of reticle heating can be evaluated as a function of heat induced overlay errors. The overlay errors further can be scaled to the critical dimension to characterize reticle heating effects. The main parameters associated with reticle heating are absorber reflectivity, substrate absorption and pattern density.

Figure 1:
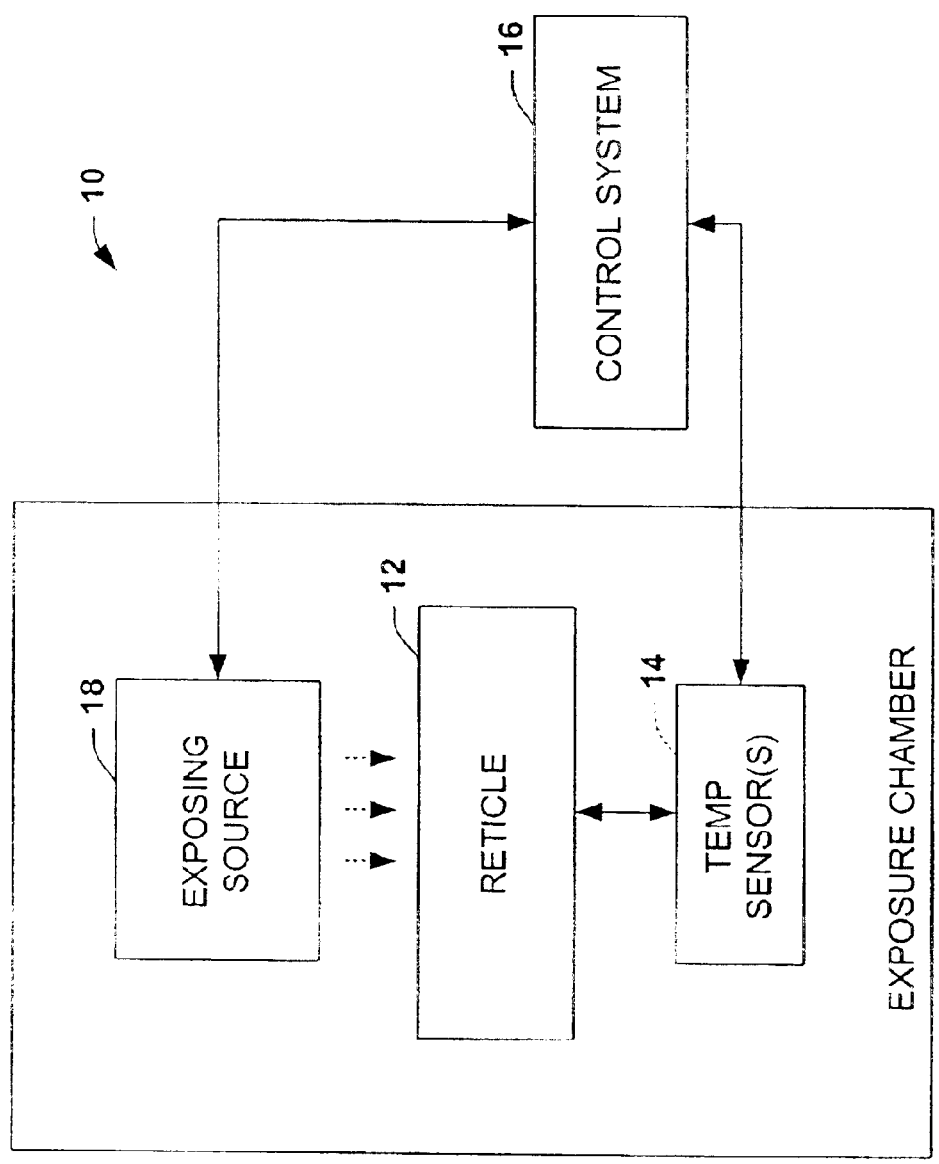
FIG. 1 is a functional block diagram of a system that may be employed to monitor reticle temperature in accordance with an aspect of the present invention.

FIG. 1 illustrates an example of a system 10 operative to monitor and/or regulate temperature of a reticle 12 in accordance with an aspect of the present invention. One or more temperature sensors 14 sense the temperature of the reticle 12 and provide temperature signals indicative of the sensed temperature characteristics. The temperature sensors 14 can be operatively coupled to the reticle 12 and sense temperature by conduction. Alternatively or additionally, the sensors 14 can be spaced apart from the reticle to discern an indication of reticle temperature by a noncontact temperature sensing technique (e.g., thermography).

The temperature sensor 14 is coupled to a control system 16 for providing the temperature signals indicative of the temperature sensed by the sensor. The control system 16 is coupled to an exposing source 18. The exposing source 18 is operative to apply radiation onto the patterned reticle 12 to transfer the corresponding illuminated pattern onto an associated substrate (e.g., a wafer). For example, the exposing source 18 can apply light of a predetermined wavelength (e.g., 70 nm, 157 nm, 193 nm, 248 nm, etc.) onto the reticle 12.

The reticle 12 typically is employed in a step-and-scan configuration in which the reticle pattern is exposed onto a wafer by synchronously scanning the reticle 12 and an associated wafer. In situations when only portions of the reticle 12 are scanned at a time, the portions being scanned can become hotter than portions not being scanned. Consequently, the portion undergoing scanning can thermally distort as a result of thermal expansion thereof, which can cause overlay errors. The significance of such overlay errors further increases as critical dimensions for semiconductor devices continue to decrease.

In accordance wvith an aspect of the present invention, the control system 16 is programmed and/or configured to control the exposing source 18 to mitigate reticle heating outside of expected operating parameters. By way of example, the control system 16 can vary the exposure time for the reticle 12 as a function of the sensed reticle temperature to mitigate reticle heating effects.

In one aspect, the control system can compare the sensed temperature characteristics of the reticle 12 relative to stored temperature information. The stored temperature information can be collected over time for the reticle to provide an indication of reticle heating during an exposure process. The stored temperature information further can correlate exposure time for different parts of the reticle and the temperature for the respective different parts, such as over one or more previous exposure cycles. Accordingly, the control system 16 can discern an appropriate value for exposure time in real time as a function of the sensed reticle temperature relative to the stored data. For example, the exposure time can be decreased for a subsequent exposure cycle if the sensed temperature data indicates a temperature condition that exceeds a threshold. In addition or alternatively, if the temperature data indicates a temperature condition below a different threshold, the exposure time can be increased for a subsequent exposure cycle.

As a result of adjusting exposure time based on reticle temperature, reticle heating effects can be mitigated while still permitting desirable production rates. It will be understood and appreciated that the reticle temperature can provide real time feedback so that the exposure time for wafers in a production lot can vary based on temperature conditions of the reticle during previous recent exposure cycles.

Figure 2:
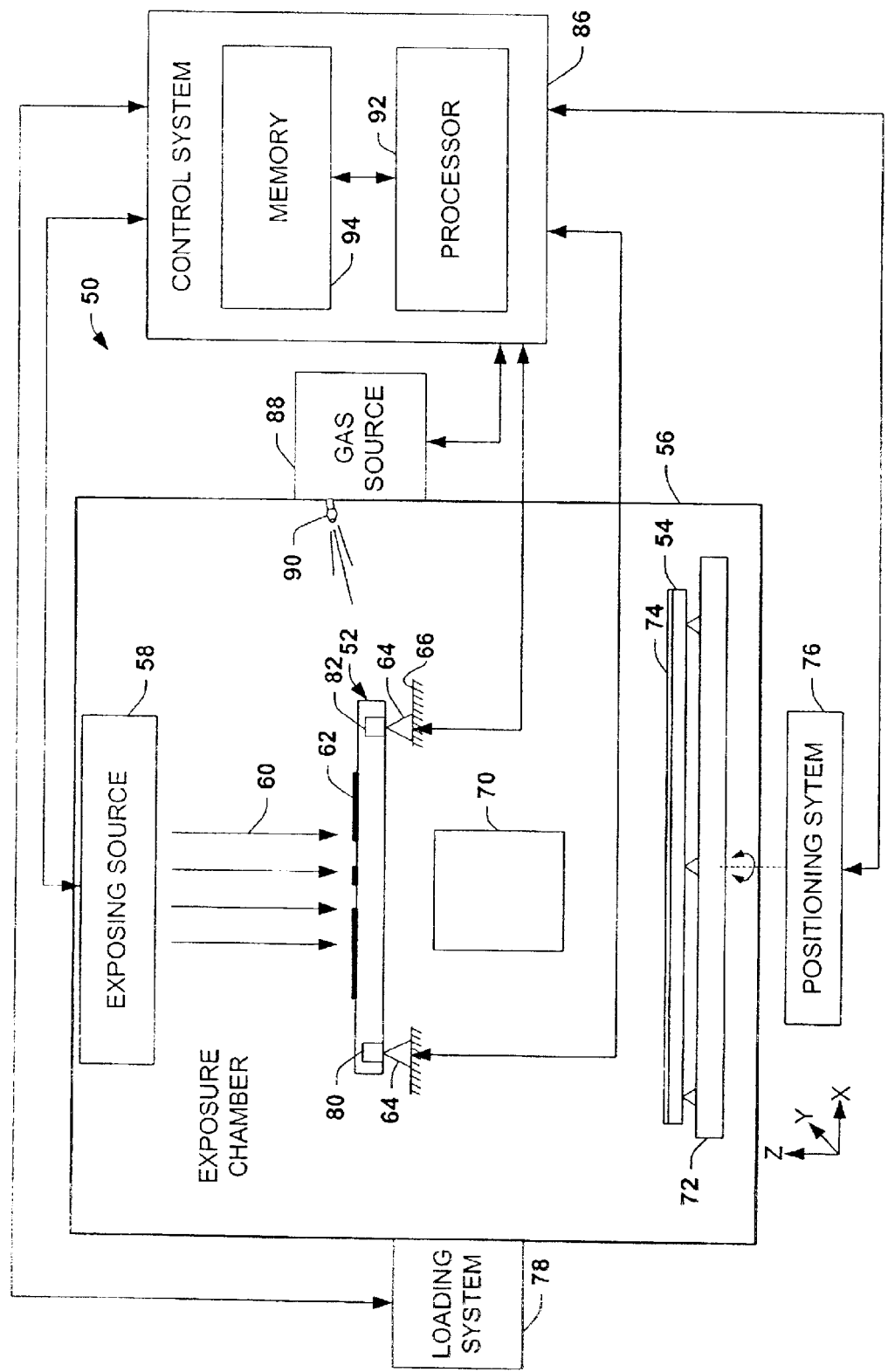
FIG. 2 is a block diagram of a semiconductor processing system operative to monitor reticle temperature in accordance with an aspect of the present invention.

FIG. 2 illustrates an example of a processing system 50 that can be utilized to expose a mask or reticle (hereinafter referred collectively as "reticle") 52 to radiation, such as for patterning wafers 54, in accordance with an aspect of the present invention.

The system 50 includes an exposure chamber 56 having an exposing source 58 operative to expose the reticle 52 to a high or low energy wavelength exposure 60. The reticle 52 includes an imaging pattern 62, such as formed in chromium. The reticle 52 is supported by a support structure 64 associated with a stage 66 for supporting the reticle in a position to receive the radiation 60. The imaging pattern 62 is employed to transfer corresponding images onto a resist-coated surface of the wafer 54, such as during a step-and-scan exposure process. In a particular aspect, the exposing source 58 provides short wavelength radiation 60, such as may have a specified wavelength less than about 300 nm.

By way of example, the exposing source 58 can be operative to illuminate the reticle 52 with light 60 having an exposure wavelength of 157 nm, 193 nm, or 248 nm. The exposing source 58 can be an excimer laser source, which provides wavelengths in the deep ultraviolet region, including 248 nm (KrF), 193 nm (ArF), and 157 nm ($F_2$). However, other light sources and wavelengths could be used and should be apparent to those skilled in the art.

A projection lens system 70 is interposed between the reticle 52 and the wafer 54. The wafer 54 is supported by a support/chuck 72 to receive light from the projection lens system 70. The projection lens system 70, in turn, projects the design pattern of the reticle 52 onto a photoresist layer 74 disposed on a wafer 54, while in most cases substantially reducing the size of the imaged design pattern. By way of illustration, the support 72 includes a mechanism to vacuum-absorb the wafer 54 at a desired position. A positioning system 76 is operatively coupled to move the stage 72 in two or more dimensions (e.g., an X-direction, a Y-direction and/or to provide for slight rotation).

The system 50 also may include a load system 78 operatively connected to the processing chamber 56 for loading and unloading substrates (e.g., wafers) into and out of the chamber. The load system 78 typically is automated to load and unload the wafers into the chamber 56 at a controlled rate, which can vary according to the process conditions in the chamber.

In accordance with an aspect of the present invention, one or more temperature sensors 80 and 82 are operative to sense temperature characteristics of the reticle 52. In the example of FIG. 2, the temperature sensors 80 and 82 are depicted as being attached to or integrated into the reticle 52. While, for purposes of simplicity of illustration, two such sensors 80 and 82 are shown in FIG. 2, those skilled in the art will understand and appreciate that a greater number of such sensors usually used to monitor temperature of the reticle 52. Each of the sensors is operative to sense temperature associated with a part of the reticle where the sensor is located. It further will be understood and appreciated that appropriate sensors (e.g., thermistors) can be attached at appropriate reticle locations. Other types of sensors could be integrated into the supports 64, implemented as part of a pellicle attached to the reticle, or noncontact sensors (e.g., thermal imaging sensors), in accordance with an aspect of the present invention. When thermal imaging is employed, appropriate filtering of thermal data can be employed to mitigate interference of the radiation from the exposing source 58.

A control system 86 receives temperature information from the temperature sensors 80 and 82. For example, the temperature sensors 80 and 82 could be electrically coupled to the control system 86 by a circuit formed of the supports 64, which include electrically conductive portions that engage contacts coupled to the sensors 80 and 82. Alternatively, non-contact (e.g., inductive or wireless) communication architectures also could be used to provide temperature information from the sensors 80 and 82 at the reticle 52 to the control system 86.

The positioning system 76 also is controlled by the control system 86. Thus, the control system 86 is operative to position the wafer 54 at a desired position in the chamber 56, such that a desired portion of the wafer is exposed by an imaged pattern from the lens system 70.

The control system 86 also is coupled to the exposing source 58 and the loading system 78. The control system 86 is operative to control the exposing source 58 to emit radiation for a determined exposure time. For example, the control system 86 controls the exposing source 58 to emit the light 60, such that the reticle 52 is illuminated for a desired time period with a desired wavelength of light. In accordance with an aspect of the present invention, the control system 86 controls the exposure time based on the sensed temperature condition of the reticle 52. The control system 86 also can receive feedback from the exposing source 58, such as a measure of the energy and/or wavelength of the light 60. After a given part of the wafer has been exposed for the desired exposure time, the control system 86 is operative to cause the positioning system to step to the wafer portion to be scanned.

The system 50 also can include a source 88 of an inert gas, such as Nitrogen ($N_2$) or Helium ($He_2$). One or more nozzles 90 are connected with the gas source 88 to enable flow of inert gas into the exposure chamber 56. The control system 86 is coupled to the gas source 88, such as to selectively control the flow of gas from the nozzle 90. The control system 86 further can monitor and control the ambient temperature and pressure conditions within the chamber 56, as well as moisture within the chamber. In an ambient environment, $O_2$ and $H_2O$ tend to attenuate shorter wavelength radiation between a source of illumination and the mask or reticle 52. The flow of inert gas into the chamber 56 thus provides an environment that facilitates radiation of the reticle 52 for shorter wavelength radiation, such as about 157 nm or less. The inert gas further can help cool the reticle 52, such that as the reticle temperature decreases during exposure, the control system 86 can increase the exposure time of the reticle. As reticle temperature decreases, the control system 86 can control the exposing source 58 to increase exposure time and/or reduce time between exposure cycles.

The control system 86, for example, includes a processor 92 coupled to memory 94 for controlling the system 50. The manner in which the processor 92 can be programmed to carry out the functions relating to the present invention will be readily apparent to those having ordinary skill in the art based on the description provided herein. The memory 94 stores program code executed by the processor 92 for carrying out operating functions of the system 50 as described herein.

For example, the memory 94 can store executable code that enables selection and control of the wavelength, energy, pulse rate, and the exposure cycle time period of the exposing source 58. The memory 94 further can store executable code to control application of gas from the gas source 88 into the chamber 56 as well as positioning of the wafer 54 (by controlling the positioning system 76).

By way of further example, the control system 86 can be programmed and/or configured to generate a topographic map of the reticle 52, which the surface area divided into a plurality of zones or regions. Associated temperature information derived based on the information collected by the sensors 80, 82 can be mapped into corresponding zones to provide a temperature profile for the reticle 52. The temperature profile can be further employed to propagate a reticle temperature database, which is stored in the memory 94. The database can include temperature condition data for each reticle zone as a function of time. Temperature profiles thus can be stored in memory 94 for the current and previous exposure cycles. The memory 94 further can be programmed to analyze reticle temperature characteristics over time to discern whether adjustments to exposure time as desired. When a temperature condition of the reticle (or a portion thereof) is determined to be outside of an expected temperature condition, the control system 86 can adjust the exposure time accordingly.

Figures 3, 4:
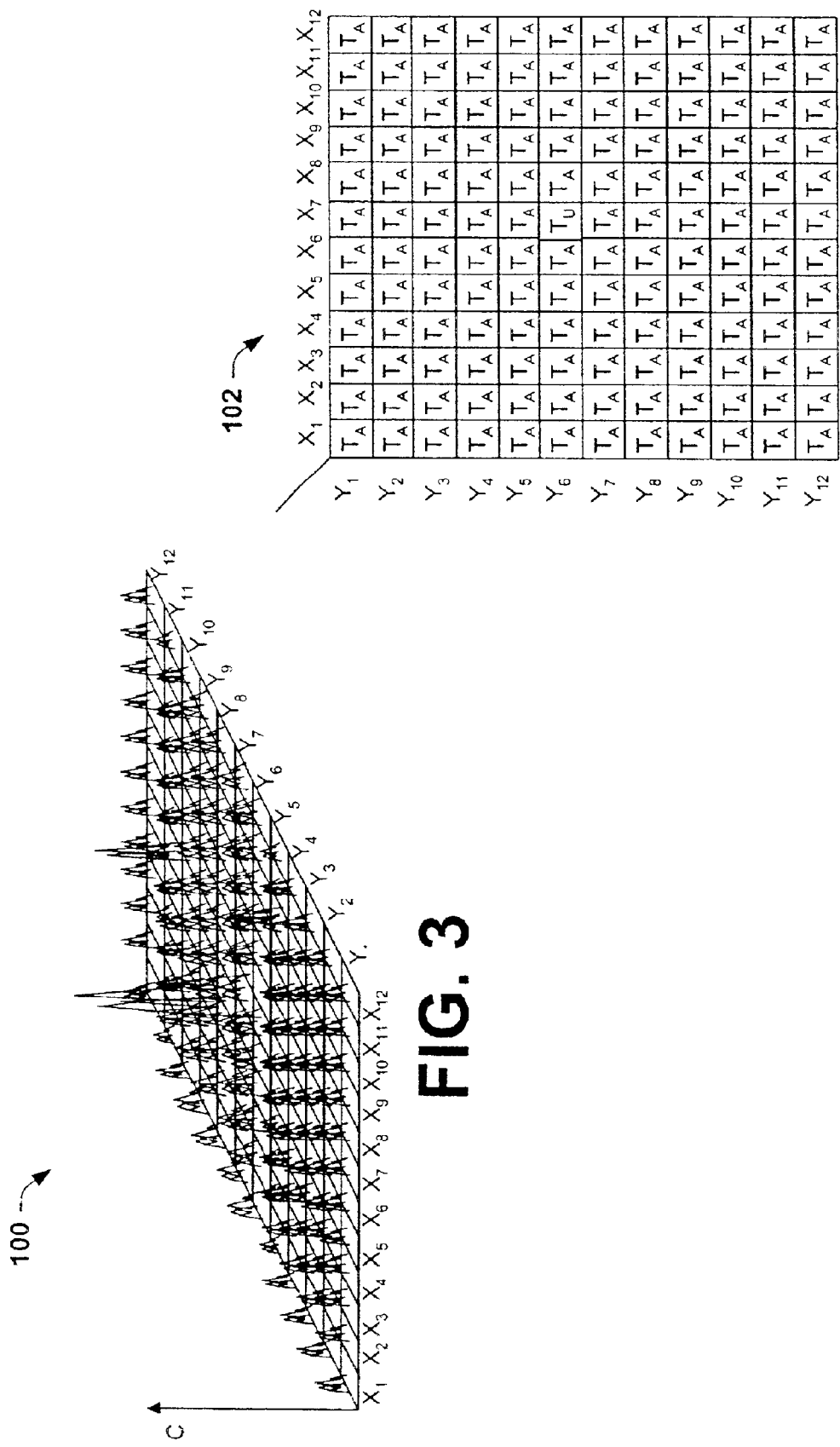
FIG. 3 is a representative three-dimensional grid map of a reticle illustrating temperature amplitudes taken at grid blocks of the grid map in accordance with an aspect of the present invention.
FIG. 4 is a temperature amplitude table correlating the temperature amplitudes of FIG. 3 with desired values for the temperature amplitudes in accordance with an aspect of the present invention.

By way of further example, FIG. 3 illustrates a three-dimensional representation 100 of a temperature profile for the reticle 52 (FIG. 2) at a given instant in time. While in FIG. 3, the reticle has been mapped (partitioned) into 144 grid block portions, the reticle 52 (FIG. 2) could be mapped with any suitable number of zones and/or into other coordinate systems. The temperature amplitudes of each zone of the reticle are shown. In FIG. 3, each respective zone of the reticle ($X_1, Y_1 \ldots X_{12}, Y_{12}$) has a temperature, which was sensed by a temperature sensor associated with each respective zone. Alternatively, temperature data for the temperature sensors can be analyzed and the temperature for each of the predetermined zones can be extrapolated (e.g., by statistical analysis of the temperature data). Alternatively, one or more noncontact temperature sensors can sense temperature characteristics of the reticle and map the temperature characteristics to respective zones of the reticle, which can be stored in memory 94 (FIG. 2) as temperature data.

The temperature data further can be evaluated over time to predict trends associated with increasing or decreasing reticle heating. As can be seen from FIG. 3, the temperature of the reticle at coordinates $X_7, Y_6$ and $X_7, Y_{10}$ are substantially higher than the temperature of the other reticle zones. Temperature information similar to that shown in FIG. 3 is collected and stored as historical temperature data for the reticle as a function of time. The historical temperature data can be stored for the current exposure cycle as well as one or more recent other exposure cycles for the substrate. The historical database provides useful temperature information based on which process parameters, including exposure time, can be adjusted so as to inhibit reticle heating above acceptable temperature parameters.

FIG. 4 is a representative table 102 of temperature amplitudes (taken at the various grid blocks). The temperature amplitude values have been correlated with acceptable temperature amplitude values for the portions of the reticle 52 (FIG. 2) mapped by the respective zones. The table 102, for example, could be derived based on comparing a temperature condition associated with each zone relative to a temperature condition threshold, which can be derived based on the current and/or previous exposure cycles. For example, if $\text{Temp}_{x,y} > \text{Temp}_{threshold}$, then the temperature condition for that zone can be labeled as unacceptable $T_U$. If $\text{Temp}_{x,y} \leq \text{Temp}_{threshold}$, then the temperature for that zone can be labeled as acceptable $T_A$. Alternatively, an average temperature can be derived for each zone, such as based on a comparison of temperature values for each respective zone. The zones determined as having temperature conditions that increase (or decrease) at a rate that exceeds a predetermined threshold further can be labeled as unacceptable $T_U$. A determined rate of temperature change (e.g., increase or decrease) also can be used in conjunction with the determined zone temperature to determine whether the temperature condition for each zone is acceptable or unacceptable. The control system 86 thus can employ the temperature condition information to control exposure time of the reticle 52 (FIG. 2), in accordance with an aspect of the present invention. For example, the control system 86 can be programmed to decrease the exposure time for the subsequent exposure cycle based on the temperature information associated with current and/or previous exposure cycles indicating a temperature condition that exceeds a threshold temperature condition. In a similar manner, the control system 86 can increase the exposure time for the subsequent exposure cycle based on the temperature information associated with current and/or previous exposure cycles indicating a temperature condition below a threshold temperature condition. Different threshold conditions can be used to adjust the exposure time up and down, both of which can be variable thresholds based on process parameters and the temperature condition data stored in the memory 94.

As can be seen in FIG. 4, all of the grid blocks except grid blocks $X_7 Y_6$ and $X_7, Y_{10}$ have temperature conditions corresponding to acceptable temperature conditions ($T_A$) (e.g., are within an expected range), while grid blocks $X_7 Y_6$ and $X_7, Y_{10}$ have undesired temperature conditions ($T_U$). Thus, with reference between FIGS. 2 and 4, the control system 86 has determined that an undesirable temperature condition exists (or is likely to exist at a time in the near future) at the portion of the reticle 52 mapped by grid blocks $X_7 Y_6$ and $X_7, Y_{10}$.

The control system 86 can control the exposing source 58 to adjust the exposure time based on determining that the respective portions of the reticle 52 have (or likely will have) undesired temperature conditions. The adjustment to exposure time, for example, can be implemented during the next exposure cycle and for subsequent wafers. That is, the control system 86 can proactively adjust exposure time for subsequent exposure cycles so as to mitigate reticle heating in accordance with an aspect of the present invention.

By way of further example, when a reticle zone is exposed to light from the exposing source, that zone and surrounding zones tend to experience temperature increases during exposure. The temperature increases are proportional to the exposure time. By examining recent temperature conditions for each zone relative to corresponding temperature conditions based on the historical temperature database, the control system 86 can determine appropriate adjustments to exposure time for subsequent exposure cycles in accordance with an aspect of the present invention. That is, a correlation of the recent temperature with the historical temperature characteristics can be used to determine whether the reticle temperature condition for one or more zones is likely to increase beyond an acceptable level if the exposure time remains substantially the same. Such a determination further enables the control system to determine an exposure time for subsequent wafers that will allow reticle temperature to remain substantially the same or decrease. Further, when a reticle temperature condition is determined to be decreasing at a rate below threshold rate, the control system can readjust exposure time to a level that will facilitate production. Accordingly, the sensed reticle temperature in conjunction with historical reticle temperature data provide a feedback mechanism to adjust exposure time for future exposure cycles to mitigate reticle heating effects. Because reticle heating is mitigated, in accordance with an aspect of the present invention, overlay errors and other patterning defects, which are caused by thermal expansion of the reticle, can be reduced.

Figure 5:
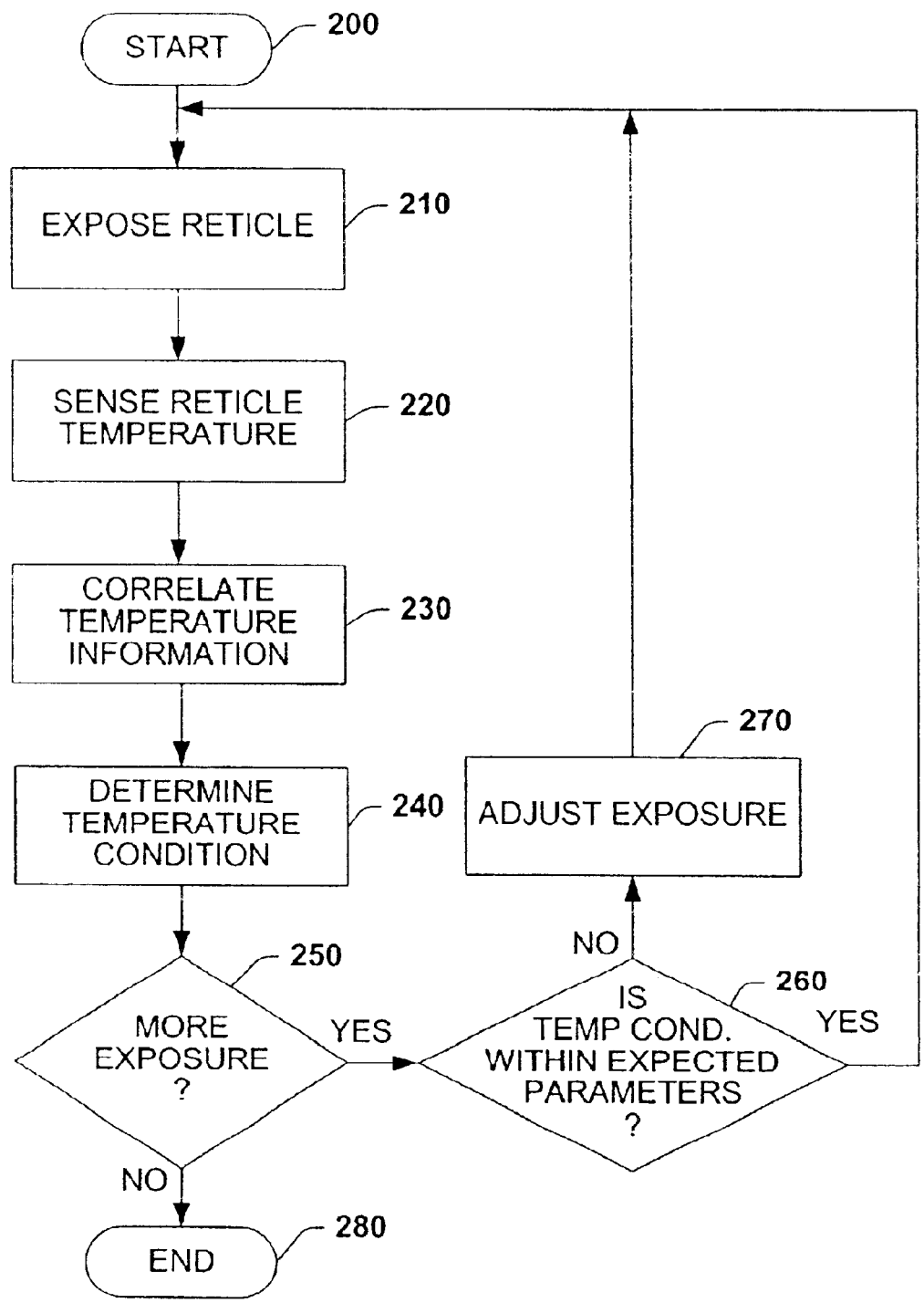
FIG. 5 is a flow diagram illustrating a methodology to monitor and control reticle temperature in accordance with an aspect of the present invention.

In view of the foregoing structural and functional features described above, methodologies that may be implemented in accordance with the present invention will be better appreciated with reference to FIG. 5. While, for purposes of simplicity of explanation, the methodology of FIG. 5 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect the present invention. It is further to be appreciated that much of the following methodology can be implemented as computer-executable instructions, such as software stored in a computer-readable medium or as hardware or as a combination of hardware and software.

Turning now to FIG. 5, the methodology begins at 200, in which general initializations occur, such as in response to a wafer and reticle being loaded into an exposure chamber. Such initializations might include powering up motive systems and associated light source(s), allocating memory, setting initial values for variables, etc. One or more temperature sensors are operative to sense temperature of the reticle, such as at a plurality of spaced apart locations during exposure. Such temperature sensors can be attached to or embedded into the reticle or be a noncontact temperature sensor. The sensors further communicate the sensed temperature information to an associated control system to facilitate control of the exposure system, such as described herein.

With the reticle and wafer in proper positions and the system initialized, at 210, the reticle is exposed by activating one or more exposing sources. For example, the exposing source can emit light of a desired wavelength (e.g., 70 nm, 157 nm, 193 nm, 248 nm, etc.) onto the reticle to illuminate the pattern imaged thereon. The pattern then is transferred onto a selected part of a resist-coated wafer, such as through lens assembly as part of a step and scan process.

At 220, the temperature of the reticle is sensed. For example, the temperature sensors provide signals indicative of the temperature for the part of the reticle at which each sensor is associated. The temperature information collected from the sensors is then correlated (230) and mapped to different zones of the reticle corresponding to the sensors' locations relative to the reticle. Such correlations further can include extrapolating the temperature information to provide higher resolution temperature data (e.g., temperature for a greater number of locations than temperature sensors). The temperature data is used to propagate a temperature database for the reticle that includes temperature characteristics for the reticle over time. The temperature database further can correlate temperature characteristics with exposure time to facilitate determining a functional relationship between exposure and reticle temperature.

At 240, a temperature condition for each zone is determined based on the temperature information derived from the sensor data. The temperature condition can be the determined temperature value at a given instant in time, a moving average temperature value, and/or a change in temperature with respect to time. A moving average can be determined as a sum of the last predetermined number of samples of the temperature values for each respective zone (e.g., the last ten temperature measurements every N milliseconds, where N is an integer >0). The average is updated by removing the oldest value, replacing it with the latest sample, and then determining the new average. A change in temperature also can be determined by differentiating the values of temperature with respect to time for each reticle zone. The temperature change thus provides an indication of the rate at which temperature is increasing or decreasing. The temperature condition information further can be correlated relative to the exposure time of the reticle to which such information relates to facilitate process control. The methodology then proceeds to 250.

At 250, a determination is made as to whether additional exposure cycles are to occur for the reticle. That is, are there additional wafers to expose? If the reticle is to experience further exposure, the methodology proceeds to 260.

At 260, a determination is made as to whether the temperature condition for each zone is within expected (e.g., acceptable) operating parameters. The expected operating parameters at each zone can further vary as a function of exposure time implemented relative to each respective zone. For example, the zone or zones that are illuminated by radiation typically will have higher expected temperature conditions than zones not being irradiated. Zones with different patterning also might exhibit different amounts of thermal expansion according to the patterning of the reticle. For example, the threshold for each zone can vary based on historical temperature data for that zone and/or based on exposure characteristics of that zone. Thus, variable threshold temperature conditions can be implemented for each zone in accordance with an aspect of the present invention. In this way, the methodology of the present invention is able to mitigate undesirable reticle temperature conditions based on particular process parameters associated with each respective zone.

If the determination at 260 is negative, indicating that the temperature condition for one or more zones is not within expected operating parameters, the methodology proceeds to 270. At 270, process parameters, including exposure time, can be adjusted for subsequent processing (e.g., future exposure cycles). By way of example, the exposure time can be decreased upon determining an increased temperature condition or a likelihood of an increased temperature condition at the current exposure levels. Alternatively, the exposure time also could be increased upon determining that the temperature condition has decreased or is decreasing at or above a predetermined rate. In addition to adjusting exposure time, other process parameters (e.g., gas flow into the chamber, pressure, etc.) also could be adjusted in accordance with an aspect of the present invention based on the sensed temperature (220). From 270, the methodology returns to 210, in which 210–250 are repeated for the next exposure cycle relative to the reticle. The next exposure cycle employs the new exposure time (and/or other process parameters), such as after then next wafer is appropriately positioned as part of a step and scan process. Then based on subsequent determinations at 250 and 260 process parameters can be adjusted for subsequent exposure cycles according the temperature condition of the reticle in the present cycle.

If the determination at 260 is affirmative, indicating that the temperature condition of each reticle zone is acceptable, the methodology returns to 210. Then, 210–250 are repeated without adjusting exposure time. If the determination at 250 is negative, indicating that the exposure process for the reticle has completed, the methodology proceeds to 280 and the methodology ends or at least is suspended. A suspension of the process, for example, corresponds to a situation when the wafer being exposed is removed from the process chamber and another wafer is loaded. Alternatively or additionally, the reticle can be unloaded from the process chamber and a new reticle be loaded for transferring different images onto the same or different wafer.

What has been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A system for regulating substrate temperature, comprising:
   an exposing source operative to expose a semiconductor reticle;
   a plurality of temperature sensors operative to proximally sense temperature characteristics of the semiconductor reticle, including during an exposure cycle; and
   a control system operative to receive temperature information indicative of the temperature characteristics sensed by the plurality of temperature sensors, the control system being proactively operative to control the exposing source based on the temperature information.

2. The system of claim 1, the exposing source further being operative to expose the reticle during a plurality of exposure cycles, the control system employing temperature information associated with at least one of current and previous exposure cycles to control the exposing source during a subsequent exposure cycle.

3. The system of claim 2, the control system controlling the exposing source to adjust exposure time for the subsequent exposure cycle based on the temperature information associated with the at least one of current and previous exposure cycles.

4. The system of claim 3, the control system effecting a decrease in the exposure time for the subsequent exposure cycle based on the temperature information associated with the at least one of current and previous exposure cycles indicating a temperature condition that exceeds a threshold temperature condition.

5. The system of claim 3, the control system effecting an increase in the exposure time for the subsequent exposure cycle based on the temperature information associated with the at least one of current and previous exposure cycles indicating a temperature condition below a threshold temperature condition.

6. The system of claim 3, the control system decreasing the exposure time for the subsequent exposure cycle based on the temperature information associated with the at least one of current and previous exposure cycles indicating a temperature condition exceeds a first threshold temperature condition and the control system increasing the exposure time for the subsequent exposure cycle based on the temperature information associated with the at least one of current and previous exposure cycles indicating a temperature condition below a second threshold temperature condition, which different from the first threshold temperature condition.

7. The system of claim 1, the plurality of temperature sensors being integrated into part of the reticle.

8. The system of claim 1, the control system being operative to determine a temperature condition for each of a plurality of zones of the reticle based on the received temperature information associated with at least one of current and previous exposure cycles.

9. The system of claim 8, the temperature condition for each of the plurality of zones including at least one of (i) an absolute temperature value equal to or derived from temperature information associated with the at least one of current and previous exposure cycles, (ii) a change in temperature value with respect to time for the at least one of current and previous exposure cycles and (iii) a moving average temperature value associated with the at least one of current and previous exposure cycles.

10. A system for regulating temperature a reticle of during exposure, comprising:
 an exposing source spaced apart from and oriented to emit radiation during an exposure cycle having an exposure time period;
 a plurality of temperature sensors associated with the semiconductor reticle and operative to proximally sense temperature of the semiconductor reticle and provide a temperature signal indicative thereof, including during an exposure cycle; and
 a control system proactively operative to discern a temperature condition of the semiconductor reticle based on the temperature signal, the control system storing data indicative of the temperature condition during at least some of the exposure cycles, the control system employing the stored temperature condition data and the discerned temperature condition of the semiconductor reticle to control the exposure time period.

11. The system of claim 10, the control system being operative to employ temperature condition data associated with at least one of current and previous exposure cycles to control the exposing source during a subsequent exposure cycle.

12. The system of claim 10, the control system being operative to at least one of (i) decrease the exposure time period if temperature condition data associated with the at least one of current and previous exposure cycles indicates a temperature condition exceeding a first threshold temperature condition and (ii) increase the exposure time period if temperature condition data associated with the at least one of current and previous exposure cycles indicates a temperature condition below a second threshold temperature condition, which is different from the first threshold temperature condition.

13. The system of claim 12, the temperature condition data further comprising at least one of (i) an absolute temperature value derived from the temperature signal received during the at least one of current and previous exposure cycles, (ii) a change in temperature with respect to time for the at least one of current and previous exposure cycles and (iii) a moving average temperature associated with the at least one of current and previous exposure cycles.

14. The system of claim 10, the control system being operative to determine a temperature condition for a plurality of different regions of the reticle based on the received temperature information associated with the at least some of the exposure cycles.

15. A system for regulating substrate temperature, comprising:
 means for proximally sensing a plurality of temperatures of a semiconductor reticle and for providing temperature information indicative thereof, including during an exposure cycle;
 means for exposing the semiconductor reticle with radiation; and
 control means for proactively controlling operation of the means for exposing based on the temperature information provided by the means for sensing temperature.

16. The system of claim 15, further comprising means for storing temperature condition data based on the temperature information, the temperature condition data indicating temperature condition of the reticle for at least one of current and previous exposure cycles.

17. The system of claim 16, the control means further comprising means for adjusting duration of exposure provided by the means for exposing during a subsequent exposure cycle based on the temperature information associated with the at least one of current and previous exposure cycles.

18. The system of claim 17, the means for adjusting further comprising means for decreasing the duration of exposure for the subsequent exposure cycle based on the temperature condition data associated with the at least one of current and previous exposure cycles indicating a temperature condition that exceeds a threshold temperature condition.

19. The system of claim 17, the means for adjusting further comprising means for decreasing the duration of exposure for the subsequent exposure cycle based on the temperature condition data associated with the at least one of current and previous exposure cycles indicating a temperature condition below a threshold temperature condition.

20. A method for regulating substrate temperature, comprising:
 exposing a semiconductor reticle with radiation;
 sensing a plurality of proximal temperatures of the semiconductor reticle and providing temperature informa tion indicative of the sensed temperature, including during an exposure cycle; and controlling the exposing in a subsequent exposure cycle proactively based on the temperature information associated with at least one of current and previous exposure cycles.

21. The method of claim 20, further comprising adjusting exposure time for the subsequent exposure cycle based on the temperature information associated with the at least one of the current and previous exposure cycles.

22. The method of claim 21, further comprising decreasing the exposure time for the subsequent exposure cycle based on the temperature information associated with the at least one of current and previous exposure cycles relative to a threshold temperature condition.

* * * * *

UNITED STATES PATENT AND TRADEMARK OFFICE
CERTIFICATE OF CORRECTION

PATENT NO. : 6,809,793 B1
DATED : October 26, 2004
INVENTOR(S) : Khoi A. Phan et al.

It is certified that error appears in the above-identified patent and that said Letters Patent is hereby corrected as shown below:

Column 2,
Line 2, please change "defied" to -- defined --.

Column 3,
Line 64, please change "wvith" to -- with --.

Column 6,
Line 43, please change "as" to -- are --.

Column 10,
Line 43, please change "temperature a reticle of during" to -- temperature of a reticle during --.

Signed and Sealed this

Nineteenth Day of July, 2005

JON W. DUDAS
*Director of the United States Patent and Trademark Office*